United States Patent [19]

Sano et al.

[11] Patent Number: 4,916,510

[45] Date of Patent: Apr. 10, 1990

[54] THIN FILM MESA TRANSISTOR OF FIELD EFFECT TYPE WITH SUPERLATTICE

[75] Inventors: Masafumi Sano, Kawasaki; Katsuji Takasu, Asaka; Hisanori Tsuda, Atsugi; Yutaka Hirai, Tokyo, all of Japan

[73] Assignee: Canon Kabushiki Kaisha, Tokyo, Japan

[21] Appl. No.: 170,101

[22] Filed: Mar. 11, 1988

Related U.S. Application Data

[63] Continuation of Ser. No. 874,132, Jun. 13, 1986, abandoned.

[30] Foreign Application Priority Data

Jun. 20, 1985 [JP] Japan .................. 60-133004

[51] Int. Cl.⁴ .................................... H01L 27/12
[52] U.S. Cl. ............................... 357/4; 357/16;
357/56; 357/23.2; 357/23.1; 357/58; 357/2; 357/55
[58] Field of Search .............. 357/4, 55, 56, 2, 58, 357/22 A, 22 MD, 16, 23.14, 23.1

[56] References Cited

U.S. PATENT DOCUMENTS

| | | | |
|---|---|---|---|
| 3,626,328 | 12/1971 | Esaki | 357/16 X |
| 3,721,583 | 3/1973 | Blakeslee | 357/16 X |
| 4,558,337 | 12/1985 | Saunier et al. | 357/22 |
| 4,642,144 | 2/1987 | Tiedje et al. | 357/4 |

OTHER PUBLICATIONS

Ableles et al, "Amorphous Semiconductor Superlattices," *Physical Review Lehers*, Nov. 21, 1983, vol. 51, No. 21, pp. 2003-2006.

Primary Examiner—William Mintel
Attorney, Agent, or Firm—Fitzpatrick, Cella, Harper & Scinto

[57] ABSTRACT

A thin film mesa type FET having a gate electrode formed on a substrate. An insulating thin film layer is formed on the gate electrode. A multilayer structure is formed on the insulating thin film layer by alternately laminating a number of non-monocrystalline semiconductor material layers and a number of non-monocrystalline insulating material layers. The thickness of the semiconductor layers is 5 to 500 Å.

5 Claims, 1 Drawing Sheet

THIN FILM MESA TRANSISTOR OF FIELD EFFECT TYPE WITH SUPERLATTICE

This application is a continuation of application Ser. No. 874,132 filed June 13, 1986, now abandoned.

BACKGROUND OF THE INVENTION

1. Field of the Invention

The present invention relates to a thin film transistor of a field effect type and, more particularly, to a field effect type thin film transistor which can also endure for high-speed use.

2. Related background art

In recent years, the characteristics of a thin film transistor (TFT) have been improved with the aid of the remarkable advancement of the amorphous semiconductor technology.

Hitherto, there has been known that the thin film transistor is formed by a multilayer material consisting of a first solid layer of a semiconductor or insulating material formed of non-monocrystalline material and a second solid layer which are alternately laminated. This thin film transistor is mainly used in the high frequency resistor circuit network, RC circuit network, and the like.

However, such thin film type transistors don't have a low threshold voltage ($V_{th}$) nor a high field effect type mobility ($\mu_{FE}$). Therefore, thin type transistor are desired which have excellent specifications regarding the threshold voltage and mobility which can be sufficiently used as a semiconductor material for a high speed device.

SUMMARY OF THE INVENTION

The present invention is made in consideration of the foregoing circumstances and it is an object of the present invention to provide a thin film transistor of the field effect type having a low threshold voltage and a large mobility.

DETAILED DESCRIPTION OF PREFERRED EMBODIMENT

Figure 1A:
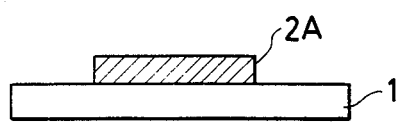
FIGS. 1A to 1D are diagrams for explaining the manufacturing processes according to an embodiment of a thin film transistor of the field effect type of the present invention.
Figure 1B:
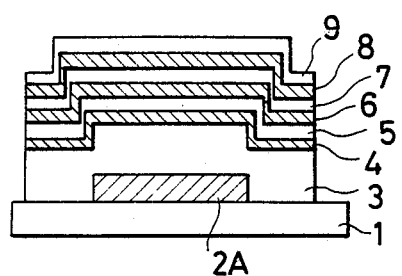

An embodiment of the present invention will be described in detail herein below with reference to the drawings. FIGS. 1A to 1D are diagrams for explaining the manufacturing processes according to an embodiment of a thin film transistor of the field effect type of the invention. FIG. 2 is a diagrammatical cross sectional view of the field effect type thin film transistor which is manufactured by those processes.

First, the main component elements will be described prior to describing the manufacturing processes.

In FIGS. 1A to 1D and 2, an electrode 2A is disposed on a substrate 1. The substrate 1 is made of an insulating material, e.g., glass plate or the like.

The electrode 2A is used as a gate (G) of this transistor. An insulating layer 3 is further formed on the electrode 2A. First solid layers 4, 6, 8, 10, ..., and second solid layers 5, 7, 9, ..., 35 are alternately laminated like a multilayer structure on the insulating layer 3. n+ layers 36A and 36B are formed on both sides of those solid layers 4 to 35 so as to sandwich them. Electrodes 2B and 2C are provided so as to be come into ohmic contact with the n+ layers 36A and 36B. The electrode 2B serves as a source (S) of this transistor and the electrode 2C serves as a drain (D).

The n+ layers 36A and 36B have high impurity concentrations.

The manufacturing processes of the field effect type thin film transistor will be described herein below with reference to FIGS. 1A to 1D.

In these diagrams, reference numeral 1 denotes the substrate consisting of an insulating material and the electrode 2A is evaporation deposited on the substrate 1. Then, the gate electrode 2A is formed due to an etching. (Refer to FIG. 1A).

Next, the insulating layer 3 may be formed by way of, e.g., a photo CVD method in the following manner. The substrate 1 formed with the gate electrode 2A is disposed in the chamber of a light CVD apparatus and held at a substrate temperature of 250° C. Next, disilane gas of 2 SCCM and ammonia gas of 60 SCCM are simultaneously injected into the chamber while controlling their flow rates by a mass flow meter. A pressure is set to 0.9 Torr and the decomposition is performed by the light of a low pressure mercury lamp at an intensity of 30mW/cm$^2$ thereby depositing an a-Si : N : H (hydroamorphous silicon nitride) film of a thickness of 1500 Å. Then, the injection of the ammonia gas is stopped and only the disilane gas is injected into the chamber. In this case, flow rate of the disilane gas is set to 25 SCCM and a pressure is set to 0.9 Torr. The decomposition is executed by the light of a low pressure mercury lamp at an intensity of 30mW/cm$^2$, thereby depositing an a-Si : H (hydroamorphous silicon) film of a thickness of 50 Å. Subsequently, an a-Si : N : H film of a thickness of 100 Å is again formed under the same conditions as above. Fifteen a-Si : H layers and fifteen a-Si : N : H layers, for example, are alternately repeatedly deposited. Refer to FIG. 1B (however, the case where respective three layers were repeatedly alternately formed is illustrated in this diagram).

Figure 1C:
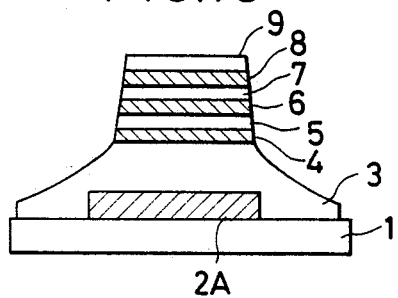
Figure 1D:
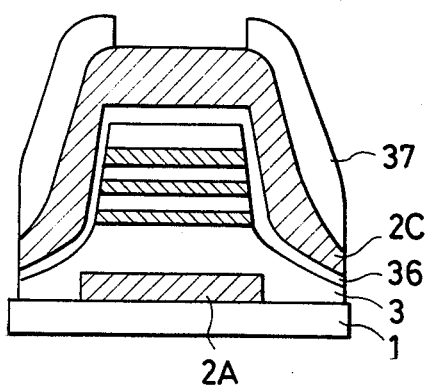
Figure 2:
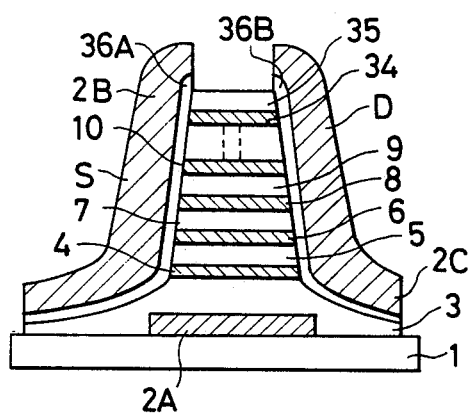
FIG. 2 is a diagrammatical cross sectional view of the field effect type thin film transistor which is formed by those processes.

As shown in FIG. 1C, what is called a mesa transistor is further formed using a resist mask smaller than the gate electrode 2A. The PH$_3$ gas and disilane of a volume ratio of 10 - 2 are again injected at a whole flow rate of 80 SCCM using a mass flow meter. In this case, a pressure is set to 0.9 Torr and a substrate temperature is set to 250° C. The decomposition is performed by a low pressure mercury lamp at intensity of 30 mW/cm$^2$ thereby forming an n+ layer of 750 Å. Next, aluminum is evaporation deposited in the vacuum condition so as to have a thickness of 1000 Å, thereby forming a multilayer sturcture as shown in FIG. 1D using a resist mask 37. The Al deposited layer and n+ layer are etched. In this manner, a transistor of a multilayer structure as shown in FIG. 2 is formed.

According to the field effect type thin film transistor manufactured as described above, multilayer materials are provided in the semiconductor channel portion. Therefore, as compared with the conventional thin transistor, the threshold voltage can be reduced and at the same time, the mobility which causes a problem when electrons flow through the semiconductor channel portion can be also increased. Therefore, this transistor can be used for a high speed device such as a high speed spectral system or the like.

The operation of the embodiment will now be described.

In the embodiment, each difference of the optical energy band gap between the first solid layers 4, 6, 8, 10, ..., 34 and the second solid layers 5, 7, 9, 11, ..., 35 is set to a value above 0.4 ev. Each thickness of the first solid layers 4, 6, 8, 10, ..., 34 is set to a value of 5 to 500 Å. Each thickness of the second solid layers 5, 7, 9, 11, ..., 35 is set to a value of 50 to 1000 Å.

The first and second solid layers are alternately laminated to form the multilayer materials consisting of a repetitive multilayer structure. The first solid layers 4, 6, 8, 10, ..., 34 serve as wells which can be quantum mechanically shut in. When the electrons are shut in these wells, the quantization is progressed in the vertical direction (direction of a Z axis) for the first solid layers 4, 6, 8, 10, ..., 34.

By increasing the thicknesses of the second solid layers 5, 7, 9, 11, ..., 35 as thick as possible, the electrons existing in the first solid layers 4, 6, 8, 10, ..., 34 are completely shut in these first solid layers. In this manner, by setting the thicknesses of the wells (the first solid layers) and of the barriers (the second solid layers) to proper values, the electrons existing in the substance move only in the vertical direction for the wells. Further, the thicknesses of the second solid layers 5, 7, 9, 11, ..., 35 are set to be so thin that the electrons at the quatization level can tunnel through the first solid layers 4, 6, 8, 10, ..., 34. Thus, the electrons freely move in the solid layers of the multilayer structure at the quantization level.

Therefore, by providing the multilayer structure which presents the quantization effect for the semiconductor channel portion, the field effect type thin film transistor having a low threshold voltage and a large mobility can be provided.

As a method of manufacturing field effect type transistors, the field effect type thin film transistor can be also produced by the following method. Namely, a-SiGe : H films each having a thickness of 50 Å are formed as the first solid layers by use of the germane gas containing 10% of disilane. Then, as the second solid layers, a-Si : C : H (hydroamorphous silicon carbide) films each having a thickness of 100 Å are formed by use of the disilane gas and methane gas.

It is sufficient to form one or more layers as the number of layers of each of the first and second solid layers. However, it is desirable to set the numbers of first and second solid layers to tens or more.

Although the photo- CVD method has been used as a method of manufacturing the first and second solid layers in the above embodiment, the invention is not limited to only this method. For example, it is also possible to use glow discharge method, sputtering method, HOMO-CVD method, high vacuum evaporation depositing method, or the like.

As described above, the difference of the optical energy band gap between the first and second solid layers is set to above 0.4 eV. The thicknesses of the first and second solid layers are set to values such that the quantization effect is derived in the case of such a difference above 0.4 ev. These first and second solid layers are alternately laminated and such multilayer materials are repeatedly laminated to form a multilayer structure. These multilayer materials are provided for the semiconductor channel portion. Therefore, the mobility of electrons can be increased and at the same time the threshold voltage can be reduced. Thus, the thin film transistor manufactured by the method of the present invention can be used as a transistor for a high speed device such as a high speed spectral system or the like.

We claim:

1. A thin film mesa type field effect transistor comprising:
    a substrate,
    a gate electrode formed on said substrate;
    an insulating thin film layer formed on said gate electrode subsequent to formation of the gate electrode on said substrate;
    a multilayer structure formed on said insulating thin film layer subsequent to formation of said insulating thin film layer by alternately laminating a number of first solid layers each comprising a non-monocrystalline semiconductor material and a number of second solid layers each comprising non-monocrystalline material,
    wherein a difference of an optical energy band gap between said first and second solid layers is set to be greater than 0.4 eV, and a thickness of a single layer of each of said first and second layers has a value such that a quantum effect is obtained; and
    a drain electrode and a source electrode, said multilayer structure being sandwiched by said drain electrode and said source electrode.

2. A thin film transistor according to claim 1, wherein each of said first solid layers is made of a material selected from the group consisting of hydroamorphous silicon and hydroamorphous silicon germanium, and each of said second solid layers is made of a material selected from the group consisting of hydroamorphous silicon carbide and hydroamorphous silicon nitride.

3. A thin film transistor according to claim 1, wherein a thickness of each of said first solid layers is 5 to 500 Å.

4. A thin film transistor according to claim 1, wherein a thickness of each of said second solid layers is 50 to 1000 Å.

5. A thin film mesa type field effect transistor according to claim 1, wherein said second solid layers comprise a non-monocrystalline material having an insulating property.

* * * * *

UNITED STATES PATENT AND TRADEMARK OFFICE
CERTIFICATE OF CORRECTION

PATENT NO. : 4,916,510
DATED : April 10, 1990
INVENTOR(S) : MASAFUMI SANO ET AL.

It is certified that error appears in the above-identified patent and that said Letters Patent is hereby corrected as shown below: Title page:

AT [56] REFERENCES CITED

Other Publications, "*Lehers,*" should read --*Letters,*--.

COLUMN 1

Line 29, "transistor" should read --transistors--.

COLUMN 2

Line 6, "36B." should read --35B.--.

COLUMN 3

Line 8, "0.4 ev." should read --0.4 eV.--.

COLUMN 4

Line 8, "0.4 ev." should read --0.4 eV.--.
Line 21, "substrate," should read --substrate;--.

Signed and Sealed this

Twenty-fifth Day of February, 1992

Attest:

HARRY F. MANBECK, JR.

*Attesting Officer*   Commissioner of Patents and Trademarks